United States Patent
Sobu et al.

(10) Patent No.: US 7,504,759 B2
(45) Date of Patent: Mar. 17, 2009

(54) SURFACE ACOUSTIC WAVE ELEMENT, SURFACE ACOUSTIC WAVE DEVICE, DUPLEXER, AND METHOD OF MAKING SURFACE ACOUSTIC WAVE ELEMENT

(75) Inventors: Masaki Sobu, Tokyo (JP); Katsunori Osanai, Tokyo (JP)

(73) Assignee: TDK Corporation, Tokyo (JP)

( * ) Notice: Subject to any disclaimer, the term of this patent is extended or adjusted under 35 U.S.C. 154(b) by 366 days.

(21) Appl. No.: 11/071,303

(22) Filed: Mar. 4, 2005

(65) Prior Publication Data

US 2005/0200234 A1    Sep. 15, 2005

(30) Foreign Application Priority Data

Mar. 9, 2004    (JP) .............................. 2004-066276

(51) Int. Cl.
    *H01L 41/08*    (2006.01)
(52) U.S. Cl. ................................. 310/313 R
(58) Field of Classification Search .. 310/313 A–313 R, 310/193, 187, 186; *H01L 41/08*
    See application file for complete search history.

(56) References Cited

U.S. PATENT DOCUMENTS

| | | | |
|---|---|---|---|
| 5,426,340 A * | 6/1995 | Higaki et al. ........... | 310/313 R |
| 5,796,205 A * | 8/1998 | Nishihara et al. ....... | 310/313 R |
| 5,889,446 A * | 3/1999 | Yamada et al. .............. | 333/193 |
| 5,923,231 A * | 7/1999 | Ohkubo et al. .............. | 333/193 |
| 6,734,601 B2 * | 5/2004 | Taga ...................... | 310/313 R |

FOREIGN PATENT DOCUMENTS

| | | | |
|---|---|---|---|
| CN | 1203899 A | | 1/1999 |
| JP | A-10-107573 | | 4/1998 |
| JP | A-10-126207 | | 5/1998 |
| JP | A-10-163802 | | 6/1998 |
| JP | A-10-256862 | | 9/1998 |
| JP | 2001-168676 | * | 6/2001 |
| JP | A-2001-168676 | | 6/2001 |
| JP | A-2004-364041 | | 12/2004 |
| JP | A-2005-244670 | | 9/2005 |

OTHER PUBLICATIONS

Japanese Office Action issued Jun. 26, 2007 (2 pages) with English-language translation (pp. 1-5).

* cited by examiner

*Primary Examiner*—Darren Schuberg
*Assistant Examiner*—Karen Addison
(74) *Attorney, Agent, or Firm*—Oliff & Berridge, PLC

(57) ABSTRACT

A surface acoustic wave element, a surface acoustic wave device, a duplexer, and a method of making a surface acoustic wave element which significantly restrain characteristics from deteriorating are provided. The surface acoustic wave element in accordance with the present invention comprises a piezoelectric substrate, and an IDT electrode formed on the piezoelectric substrate, whereas the piezoelectric substrate has a volume resistivity of not less than $3.6 \times 10^{10}$ Ω·cm and not more than $1.5 \times 10^{14}$ Ω·cm. This surface acoustic wave element comprises the piezoelectric substrate having a low volume resistivity, whereas the volume resistivity is reduced to $1.5 \times 10^{14}$ Ω·cm or less. Therefore, discharging is restrained from occurring between IDT electrodes, whereby characteristics are significantly kept from deteriorating. Also, since the volume resistivity of the piezoelectric substrate is not less than $3.6 \times 10^{10}$ Ω·cm, the IDT electrodes are significantly prevented from short-circuiting with each other.

12 Claims, 11 Drawing Sheets

Fig.5

| | Fe DOPANT RATIO(wt%) | VOLUME RESISTIVITY(Ω·cm) | SHORT-CIRCUITING | ELECTRIC BREAKDOWN RATIO(%) | GRADIENT OF SURFACE POTENTIAL SHIFT |
|---|---|---|---|---|---|
| SAMPLE A | 0.00 | 1.0E+15 | NO | 30.7 | + |
| SAMPLE B | 0.21 | 1.5E+14 | NO | 0 | − |
| SAMPLE C | 0.58 | 3.4E+13 | NO | 0 | − |
| SAMPLE D | 0.75 | 2.5E+12 | NO | 0 | − |
| SAMPLE E | 1.03 | 6.3E+11 | NO | 0 | − |
| SAMPLE F | 1.24 | 3.6E+10 | NO | 0 | − |
| SAMPLE G | 1.56 | 1.3E+09 | YES | 0 | − |

Fig.6

| TIME PASSED (sec) | SURFACE POTENTIAL MEASURED VALUE (kV) | | | | | | |
|---|---|---|---|---|---|---|---|
| | SAMPLE A | SAMPLE B | SAMPLE C | SAMPLE D | SAMPLE E | SAMPLE F | SAMPLE G |
| 10 | -3.78 | -3.20 | -2.93 | -2.43 | -0.15 | -0.10 | -0.01 |
| 20 | -4.26 | -3.15 | -2.63 | -1.04 | -0.12 | -0.08 | -0.01 |
| 30 | -4.53 | -3.08 | -2.30 | -0.63 | 0.01 | 0.01 | -0.01 |
| 45 | -4.55 | -3.05 | -2.03 | -0.23 | -0.02 | -0.01 | -0.01 |
| 60 | -4.63 | -2.96 | -1.76 | -0.03 | -0.02 | -0.02 | -0.01 |
| 80 | -4.62 | -2.92 | -1.45 | -0.03 | -0.01 | -0.02 | -0.01 |
| 100 | -4.67 | -2.89 | -1.23 | -0.02 | -0.02 | -0.01 | -0.01 |
| 120 | -4.72 | -2.82 | -1.12 | -0.01 | -0.01 | -0.01 | -0.01 |
| 180 | -4.78 | -2.71 | -1.03 | -0.01 | -0.01 | -0.01 | -0.01 |
| 240 | -4.87 | -2.50 | -0.80 | -0.01 | -0.01 | -0.01 | -0.01 |
| 300 | -4.93 | -2.40 | -0.64 | -0.02 | -0.01 | -0.01 | -0.01 |

Fig. 9

| | Mn DOPANT RATIO (wt%) | VOLUME RESISTIVITY (Ω·cm) |
|---|---|---|
| SAMPLE A | 0.00 | 1.0E+15 |
| SAMPLE B | 0.32 | 1.0E+15 |
| SAMPLE C | 0.85 | 3.6E+14 |

Fig.10

| | Cu DOPANT RATIO (wt%) | VOLUME RESISTIVITY (Ω·cm) |
|---|---|---|
| SAMPLE A | 0.00 | 1.0E+15 |
| SAMPLE B | 0.62 | 2.7E+14 |

Fig.11

| | TI DOPANT RATIO (wt%) | VOLUME RESISTIVITY (Ω·cm) |
|---|---|---|
| SAMPLE A | 0.00 | 1.0E+15 |
| SAMPLE B | 0.47 | 5.3E+14 |

SURFACE ACOUSTIC WAVE ELEMENT, SURFACE ACOUSTIC WAVE DEVICE, DUPLEXER, AND METHOD OF MAKING SURFACE ACOUSTIC WAVE ELEMENT

BACKGROUND OF THE INVENTION

1. Field of the Invention

The present invention relates to a surface acoustic wave element, a surface acoustic wave device, a duplexer, and a method of making a surface acoustic wave element.

2. Related Background of the Invention

Piezoelectric substrates employed in surface acoustic wave devices (hereinafter referred to as "SAW device") have been known to have pyroelectric property, thereby generating an uneven electric charge distribution on their surface when heated to 80° C. or higher during a heating process or during their use.

When such an uneven electric charge distribution is generated, a potential difference is caused between a plurality of interdigital transducer electrodes (hereinafter referred to as "IDT electrode") formed on the substrate, whereby discharging for alleviating the potential difference occurs. The discharging may melt the IDT electrodes, thereby causing characteristics to deteriorate, such that the frequency characteristic of the device shifts from its desired characteristic, or short-circuiting occurs. For example, there are cases where the melting of IDT electrodes is seen in 30% or more of SAW devices in a visual inspection after their making. In particular, such melting of IDT electrodes by discharging is likely to occur in recent SAW devices in which IDT electrodes are formed densely in order to respond to higher frequencies.

Therefore, SAW devices having ameliorated the uneven electric charge distribution in the piezoelectric substrate have been disclosed in Japanese Patent Application Laid-Open Nos. HEI 10-107573, HEI 10-163802, HEI 10-126207, and 2001-168676.

Namely, Japanese Patent Application Laid-Open No. HEI 10-107573 discloses a SAW device in which an undercoat layer having a given value of resistance is formed between a substrate and an IDT electrode. Japanese Patent Application Laid-Open No. HEI 10-163802 discloses a SAW device in which a protective layer having a given value of resistance is formed on an IDT electrode. Japanese Patent Application Laid-Open No. HEI 10-126207 discloses a SAW device in which a semiconductor layer having a given value of resistance is formed on an IDT electrode. Japanese Patent Application Laid-Open No. 2001-168676 discloses a SAW device in which a substrate surface located between IDT electrodes is doped.

However, the following problem exists in the conventional SAW devices mentioned above. Namely, it is quite difficult to control the respective thicknesses of the undercoat layer, protective layer, and semiconductor layer formed on the piezoelectric substrate uniformly with a high accuracy. And, it is quite difficult to control the doping depth of the substrate surface likewise. Therefore, in many cases, the respective thicknesses of the undercoat layer, protective layer, and semiconductor layer or the doping depth become uneven, and the undercoat layer and the like fail to function sufficiently for homogenizing the electric charge distribution because of this unevenness. Hence, the conventional SAW devices fail to sufficiently restrain IDT electrodes from melting by discharging.

For overcoming the above-mentioned problem, it is an object of the present invention to provide a surface acoustic wave element, a surface acoustic wave device, a duplexer, and a method of making a surface acoustic wave element which significantly restrain characteristics from deteriorating.

SUMMARY OF THE INVENTION

The surface acoustic wave element in accordance with the present invention comprises a piezoelectric substrate, and an IDT electrode formed on the piezoelectric substrate, wherein the piezoelectric substrate has a volume resistivity of not less than $3.6 \times 10^{10}$ Ω·cm and not more than $1.5 \times 10^{14}$ Ω·cm.

This surface acoustic wave element comprises a piezoelectric substrate having a low volume resistivity, whereas the volume resistivity is not more than $1.5 \times 10^{14}$ Ω·cm. The inventors have newly found that a uniform electric charge distribution is achieved when the volume resistivity of the piezoelectric substrate is as low as such, even under conditions where a uniform electric charge distribution occurs in a conventional substrate whose volume resistivity is $10^{15}$ Ω·cm or more. Thus, the occurrence of discharging between IDT electrodes is suppressed in this surface acoustic wave element, whereby characteristics are significantly restrained from deteriorating. Also, since the volume resistivity of the piezoelectric substrate is not less than $3.6 \times 10^{10}$ Ω·cm, IDT electrodes are significantly kept from short-circuiting with each other.

Preferably, the piezoelectric substrate is doped with at least one species of dopants among Fe, Mn, Cu, and Ti. The selection of the dopants mentioned above can lower the volume resistivity of the piezoelectric substrate.

Preferably, the dopant ratio of the dopants is 1.24 wt % or less. This yields a piezoelectric substrate having a volume resistivity of $3.6 \times 10^{10}$ Ω·cm or more.

Preferably, the piezoelectric substrate is mainly constituted by lithium tantalate.

Preferably, the DT electrode is constituted by Al or an Al alloy having a high orientation. This allows the IDT electrode to have a high electric power resistance.

The surface acoustic wave device in accordance with the present invention comprises a surface acoustic wave element including a piezoelectric substrate, and an IDT electrode formed on the piezoelectric substrate; wherein the piezoelectric substrate has a volume resistivity of not less than $3.6 \times 10^{10}$ Ω·cm and not more than $1.5 \times 10^{14}$ Ω·cm; and a mount board including an electrode terminal formed on a surface for mounting the surface acoustic wave element, the electrode terminal electrically connecting with the IDT electrode.

This surface acoustic wave device comprises a piezoelectric substrate having a low volume resistivity, whereas the volume resistivity is not more than $1.5 \times 10^{14}$ Ω·cm. The inventors have newly found that a uniform electric charge distribution is achieved when the volume resistivity of the piezoelectric substrate is as low as such, even under conditions where an uneven electric charge distribution occurs in a conventional substrate whose volume resistivity is $10^{15}$ Ω·cm or more. Thus, the occurrence of discharging between IDT electrodes is suppressed in this surface acoustic wave device, whereby characteristics are significantly restrained from deteriorating. Also, since the volume resistivity of the piezoelectric substrate is not less than $3.6 \times 10^{10}$ Ω·cm, IDT electrodes are significantly kept from short-circuiting with each other.

The duplexer in accordance with the present invention comprises a surface acoustic wave element including a piezoelectric substrate, and an IDT electrode formed on the piezoelectric substrate, the piezoelectric substrate having a volume resistivity of not less than $3.6 \times 10^{10}$ Ω·cm and not more than $1.5 \times 10^{14}$ Ω·cm.

This duplexer comprises a piezoelectric substrate having a low volume resistivity, whereas the volume resistivity is not more than $1.5 \times 10^{14}$ Ω·cm. The inventors have newly found that a uniform electric charge distribution is achieved when the volume resistivity of the piezoelectric substrate is as low as such, even under conditions where an uneven electric charge distribution occurs in a conventional substrate whose volume resistivity is $10^{15}$ Ω·cm or more. Thus, the occurrence of discharging between IDT electrodes is suppressed in this duplexer, whereby characteristics are significantly restrained from deteriorating. Also, since the volume resistivity of the piezoelectric substrate is not less than $3.6 \times 10^{10}$ Ω·cm, IDT electrodes are significantly kept from short-circuiting with each other.

The method of making a surface acoustic wave element in accordance with the present invention comprises the step of forming an IDT electrode on a piezoelectric substrate, doped with at least one species of dopants among Fe, Mn, Cu, and Ti, having a volume resistivity of not less than $3.6 \times 10^{10}$ Ω·cm and not more than $1.5 \times 10^{14}$ Ω·cm.

BRIEF DESCRIPTION OF THE DRAWINGS

FIG. 5 is a table listing results of an experiment measuring the volume resistivity while changing the dopant ratio of Fe;

FIG. 6 is a table showing results of measurement of how the surface potential changes as time passes;

FIG. 9 is a table listing results of an experiment measuring the volume resistivity while changing the dopant ratio of Mn;

FIG. 10 is a table listing results of an experiment measuring the volume resistivity while changing the dopant ratio of Cu; and FIG. 11 is a table listing results of an experiment measuring the volume resistivity while changing the dopant ratio of Ti.

DESCRIPTION OF THE PREFERRED EMBODIMENTS

In the following, modes which are considered the best for embodying the surface acoustic wave element, surface acoustic wave device, duplexer, and method of making the surface acoustic wave element will be explained in detail with reference to the accompanying drawings. Constituents identical or equivalent to each other will be referred to with numerals identical to each other without repeating their overlapping descriptions if any.

Figure 1:
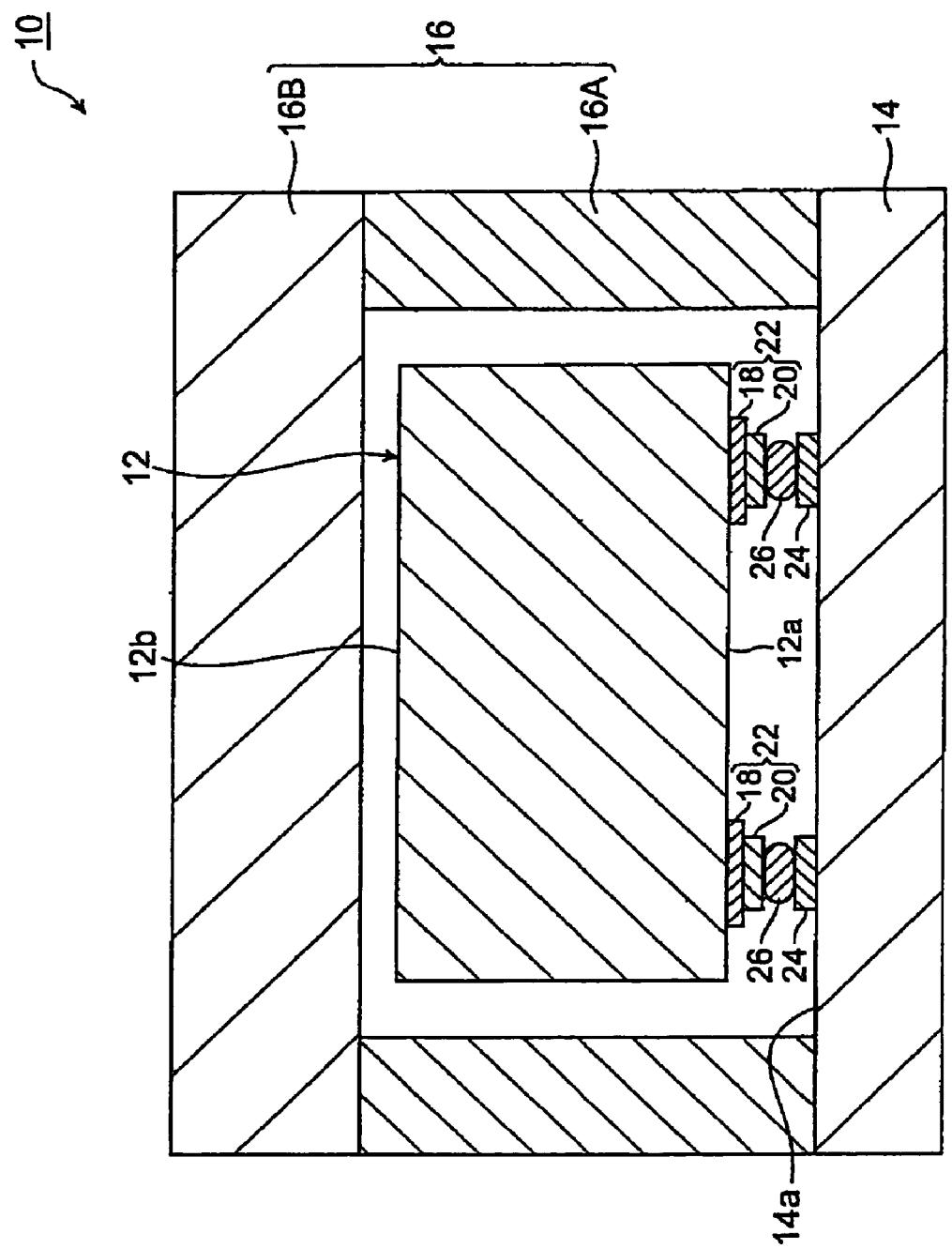
FIG. 1 is a schematic sectional view of the surface acoustic wave device in accordance with an embodiment of the present invention.

FIG. 1 is a schematic sectional view of the surface acoustic wave device in accordance with an embodiment of the present invention. As shown in FIG. 1, the surface acoustic wave device (hereinafter referred to as "SAW device") 10 in accordance with the present invention comprises a surface acoustic wave element (hereinafter referred to as "SAW element") 12, a mount board 14 for mounting the SAW element 12, and a cover 16 for sealing the SAW element 12. Formed on the lower surface 12a of the SAW element 12 are three pairs of pad electrodes 22 in which respective overlay electrodes 20 are stacked on input/output electrodes 18. In the mount board 14, the surface 14a on which the SAW element 12 is mounted is formed with gold-plated electrodes (electrode terminals) 24 for applying a voltage necessary for operating the SAW element 12. As shown in the drawings, the pad electrodes 22 are connected to their corresponding gold-plated electrodes 24 of the mount board 14 by way of Au bumps 26. The cover 16 is a member for protecting the SAW element 12 by closely sealing the same, and is constituted by two members, i.e., a dam part 16A for surrounding side faces of the SAW element 12 from four sides, and a cap part 16B for covering the upper face 12b of the SAW element 12.

Figure 2:
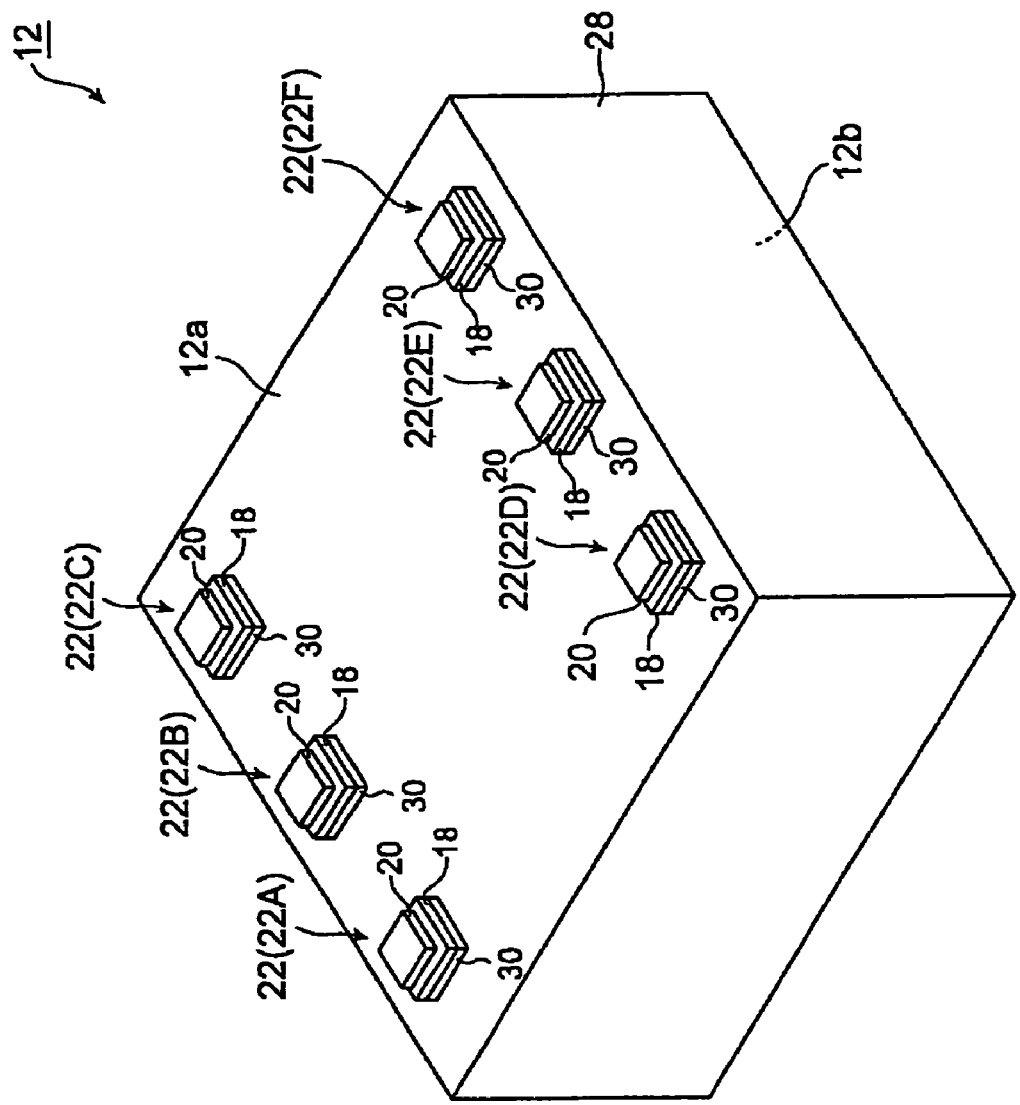
FIG. 2 is a schematic perspective view showing a surface acoustic wave element.

With reference to FIG. 2, the SAW element 12 constituting the SAW device 10 will now be explained in more detail. FIG. 2 is a schematic perspective view showing the SAW element 12. As shown in FIG. 2, the SAW element 12 comprises a piezoelectric substrate 28, buffer layers 30 laminated on the piezoelectric substrate 28, and the pad electrodes 22 formed by way of the buffer layers 30 on the piezoelectric substrate 28.

The piezoelectric substrate 28 is a substrate mainly composed of lithium tantalate (hereinafter referred to as "LT") having an ultrahigh piezoelectricity (pyroelectricity), and is formed like a rectangular column having a substantially square cross section. The piezoelectric substrate may be mainly composed of lithium niobate as well.

Each of the six pad electrodes 22 comprises an input/output electrode 18 formed from a monocrystal aluminum electrode film and an overlay electrode 20 for enhancing the thickness of the input/output electrode 18 part. The pad electrodes 22 are arranged three by three along two opposing sides of the piezoelectric substrate 28. The three pad electrodes 22 are arranged such that two of them are equidistantly spaced from the center one 22. When the SAW element 12 is mounted onto the mount board 14 in a flip chip fashion in such an arrangement of the pad electrodes 22, the center of gravity of the SAW element 12 and the center of gravity of the piezoelectric substrate 28 align in a direction normal to the surface of the mount board 14, whereby the SAW element 12 attains a high stability. The monocrystal in this specification encompasses not only complete monocrystals which are totally free of grain boundaries, but also monocrystals including slight grain boundaries and sub-boundaries and polycrystals having a high orientation.

The buffer layer 30 is constituted by TiN having a lattice constant between that of LT, which is a main component of the substrate 28, and that of aluminum, which is a material of the electrode 18.

Figure 3:
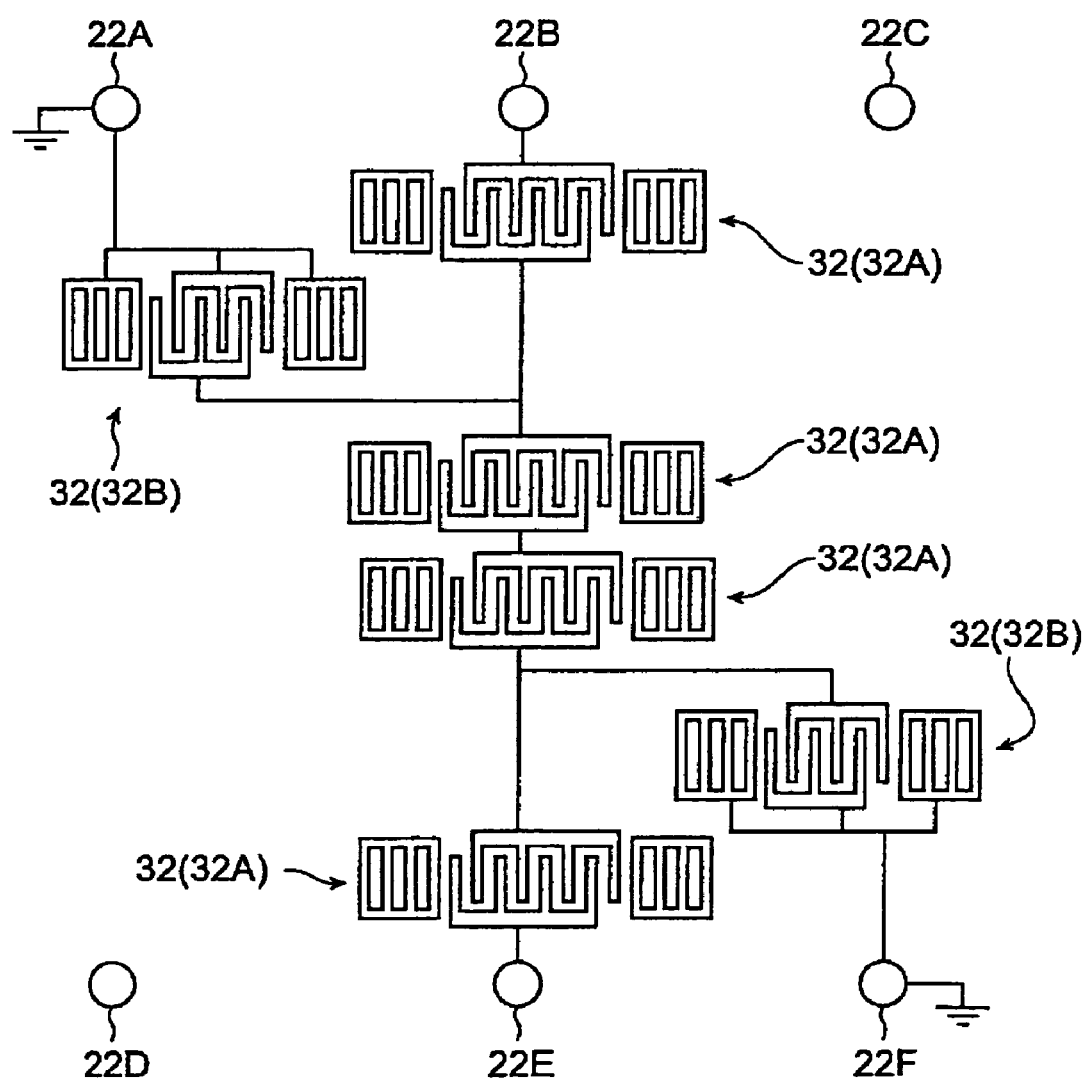
FIG. 3 is a schematic diagram showing an electrode pattern formed in the surface acoustic wave element.

Though not depicted in FIG. 2, IDT (Inter Digital Transducer) electrodes and a predetermined wiring pattern are formed on the surface 12a of the SAW element 12 as shown in FIG. 3 in addition to the pad electrodes 22. FIG. 3 is a schematic diagram showing the electrode pattern formed in the SAW element 12. 22A to 22F in FIG. 3 correspond to the pad electrodes 22A to 22F shown in FIG. 2, respectively. Among them, four pad electrodes 22A, 22B, 22E, 22F are connected to six ladder type IDT electrodes 32. Specifically, four IDT electrodes 32 (series arm resonators 32A) are connected in series between the center pad electrode 22B and the pad electrode 22E. Leads are drawn from wiring positions holding therebetween two center ones of the four series arm resonators 32A, and are connected to the pad electrodes 22A and 22F, respectively, by way of the IDT electrodes 32 (parallel arm resonators 32B). The pad electrodes 22A and 22F are grounded.

The electrode pattern is not limited to that shown in FIG. 3, and may be changed in terms of the number of IDT electrodes 32, wiring patterns, etc. However, employing an electrode pattern which is symmetrical about a point such as the one shown in FIG. 3 makes it possible for the center of gravity of the SAW element 12 and the center of gravity of the piezoelectric substrate 28 to align in a direction normal to the surface of the mount board 14 when the SAW element 12 is mounted onto the mount board 14 in a flip chip fashion, whereby the stability of the SAW element 12 can be improved.

Figure 4:
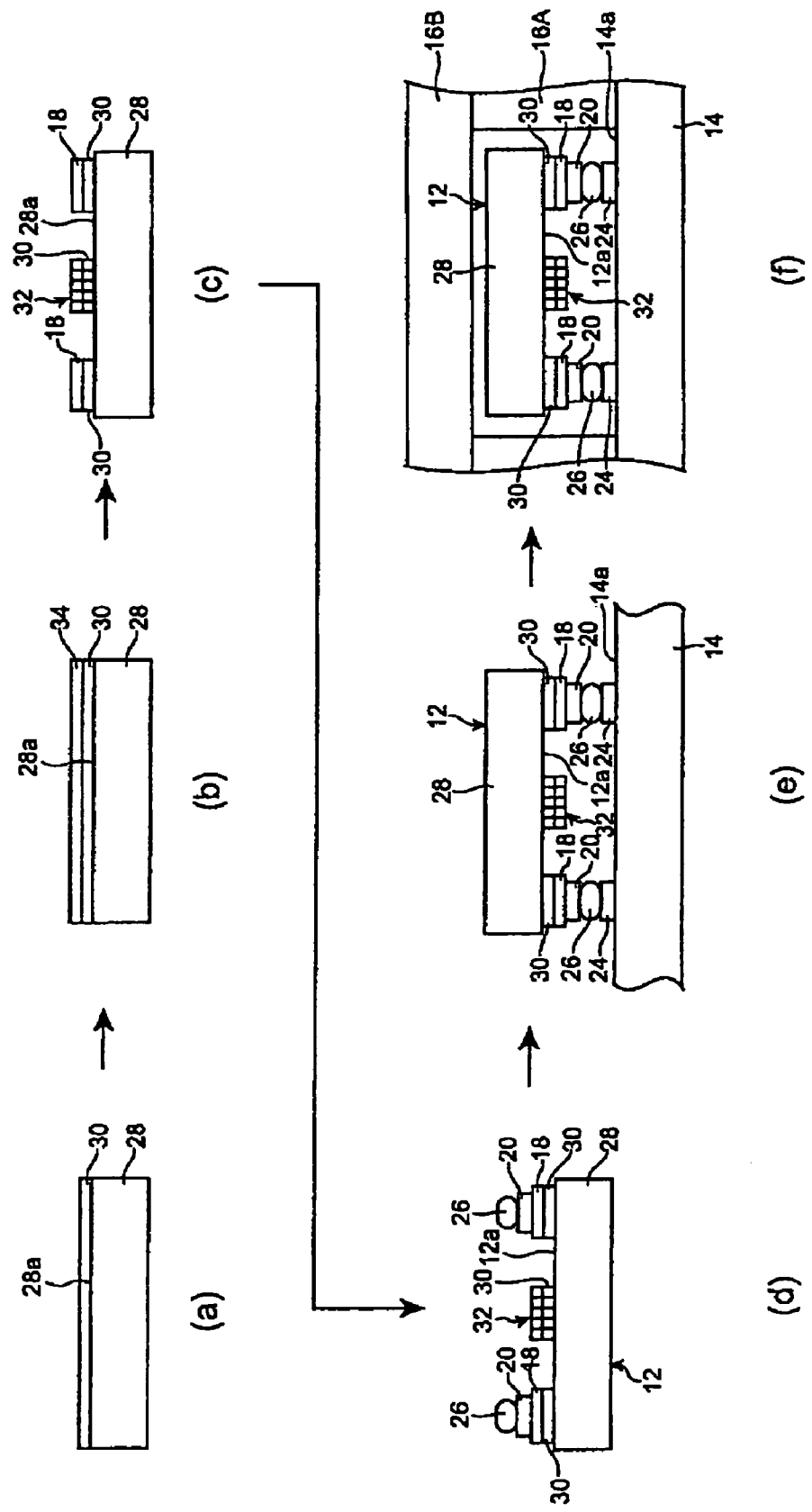
FIG. 4 is a diagram showing a procedure of making the surface acoustic wave device shown in FIG. 1.

With reference to FIG. 4, a procedure of making the SAW device 10 shown in FIG. 1 will now be explained. FIG. 4 is a diagram showing the procedure of making the SAW device 10 shown in FIG. 1.

First, a piezoelectric substrate 28 having a diameter of 3 inches (or 4 inches) is prepared. After a laminating surface 28a of the piezoelectric substrate 28 is washed with water, so as to eliminate impurities, the piezoelectric substrate 28 is set within a sputtering apparatus such that the laminating surface 28a faces a target material. Then, using metal titanium having a purity of 99.9% as a target material, sputtering is performed within a mixed gas atmosphere of nitrogen and argon, so as to form a TiN buffer layer 30 throughout the laminating surface 28a of the piezoelectric substrate 28 (see part (a) of FIG. 4).

After the buffer layer 30 is formed on the piezoelectric substrate 28, while keeping a vacuum within the sputtering apparatus, the target material is changed to aluminum, so as to form an aluminum electrode film 34 having a thickness on the order of 80 to 400 mm (e.g., 300 nm) on the piezoelectric substrate 28 (see part (b) of FIG. 4). The constituent material of the buffer layer 30 is not limited to Tin, but may be any material such as Ti, for example, as long as it has a lattice constant between that of the material of the electrode film 34 and that of the material of the piezoelectric substrate 28. Selectively employing such a material alleviates lattice mismatch, thereby making it easier for the electrode film 34 to become monocrystal. When the electrode film 34 has a high orientation as such, the input/output electrodes 18 and IDT electrodes 32 formed from the electrode film 34 also exhibit a high orientation, thereby improving the electric power resistance.

Thereafter, the piezoelectric substrate 28 is taken out of the sputtering apparatus, and the buffer layer 30 and electrode film 34 are subjected to a known photolithography (photoetching) technique such that the above-mentioned electrode patterns (see part (c) of FIG. 4) are made by a number corresponding to the number (e.g., 200) of elements to be produced. After the patterning, an overlay electrode 20 having a thickness of about 500 nm is formed on each input/output electrode 18 of the electrode patterns by the same procedure as that of making the input/output electrode 18, whereby the making of the SAW element 12 is completed. Here, the overlay electrode 20 is exposed to air, whereby an insulating film made of $Al_2O_3$ is formed on its surface. Further, a sphere of Au produced by a bump bonder is pressed against each overlay electrode 20, and ultrasonic vibrations are applied thereto at the same time, whereby a bump 26 penetrating through the insulating film formed on the surface of the overlay electrode 20 is formed (see part (d) of FIG. 4).

Between the input/output electrode 18 and the overlay electrode 20, a chromium (Cr) film for restraining Au atoms of the bump 26 from diffusing into the input/output electrode 18 or a TiN film for improving the adhesion between the input/output electrode 18 and the overlay electrode may be interposed as appropriate.

After the bump 26 is formed, the SAW element 12 is mounted in a flip chip fashion onto a mount board 14 made of BT resin. Namely, in a state where the surface 12a of the SAW element 12 formed with the bump 26 opposes the device mounting surface 14a of the mount board 14, the SAW element 12 is mounted onto the mount board 14 while positioning them such that the bump 26 and the gold-plated electrode 24 of the mount board 14 are in contact with each other. After the SAW element 12 is mounted on the mount board 14, a collet (not depicted) supports the SAW element 12 by vacuum suction and ultrasonically vibrates it in surface directions of the mount board 14, so as to join the bump 26 and the gold-plated electrode 24 to each other (see part (e) of FIG. 4).

Finally, a grid-patterned dam plate (having a thickness of 0.4 mm) made of BT resin and a planar cap plate (having a thickness of 0.2 mm) also made of BT resin are applied onto the piezoelectric substrate 28, so as to seal each SAW element 12 closely, and then dicing is performed, whereby the making of each SAW device 10 is completed (see part (f) of FIG. 4). A resin adhesive bonds the mount board 14 to the dam plate (dam part 16A), and the dam plate to the cap plate (cap part 16B).

The piezoelectric substrate 28 used for making the SAW device 10 will now be explained in detail.

The piezoelectric substrate 28 is mainly composed of LT doped with 0.58 wt % of Fe, and is produced by utilizing CZ method. A procedure of making the piezoelectric substrate 28 will be explained in brief. First, for making the piezoelectric substrate 28, LT and Fe materials are prepared, compounded at a predetermined ratio, and fully stirred. Subsequently, thus stirred LT and Fe materials are pressed into a form, which is then temporarily fired Thereafter, the fired product is put into an iridium crucible of a CZ monocrystal manufacturing apparatus, and is raised under a predetermined condition, so as to make a monocrystal ingot having a congruent composition. Then, the piezoelectric substrate 28 is cut out from the monocrystal ingot, and then is subjected to predetermined heating and surface-polishing processes, whereby the making of the piezoelectric substrate 28 is completed.

In thus produced piezoelectric substrate 28, the volume resistivity is $3.4 \times 10^{13}$ Ω·cm and thus is lower than the volume resistivity, $10^{15}$ Ω·cm, of conventional LT substrates not doped with Fe. The inventors have newly found that the electric charge distribution is significantly homogenized when the SAW device 10 is made by using the piezoelectric substrate 28 having lowered the volume resistivity as such, even under conditions where the electric charge distribution of static electricity occurring in the substrate becomes uneven in a SAW device made by using the conventional LT substrate. The reason why the electric charge distribution becomes uniform seems to be that the lower resistance in the substrate makes it easier for electric charges to migrate, thereby significantly restraining electric charges from being distributed unevenly.

The relationship between the Fe dopant ratio and the volume resistivity of the substrate will now be explained. The inventors conducted the following experiment in order to clarify the relationship between the Fe dopant ratio and the volume resistivity of the substrate. Namely, seven substrate samples (samples A to G) having the same configuration as with the piezoelectric substrate 28 except for their Fe dopant ratios were prepared, and the volume resistivity was measured in each of the samples. The table of FIG. 5 shows the results of measurement. The Fe dopant ratio of each sample was measured by a laser ICP-MS apparatus.

The table indicates that the volume resistivity of the substrate becomes lower as the Fe dopant ratio is higher. Namely, higher Fe dopant ratio seems to be more effective in homogenizing the electric charge distribution. In sample G whose Fe doping ratio was 1.56 wt %, the volume resistivity decreased to $1.3 \times 10^9$ Ω·cm, so that electricity was likely to flow through the substrate, whereby short-circuiting occurred between the IDT electrodes 32. Therefore, the lower limit of volume resistivity is $3.6 \times 10^{10}$ Ω·cm as in sample F. When the volume resistivity is substantially 0 wt %, on the other hand, the IDT electrodes are destroyed (molten) by discharging, whereby the upper limit of volume resistivity is $1.5 \times 10^{14}$ Ω·cm as in sample B in which no electric breakdown was seen.

Figure 7:
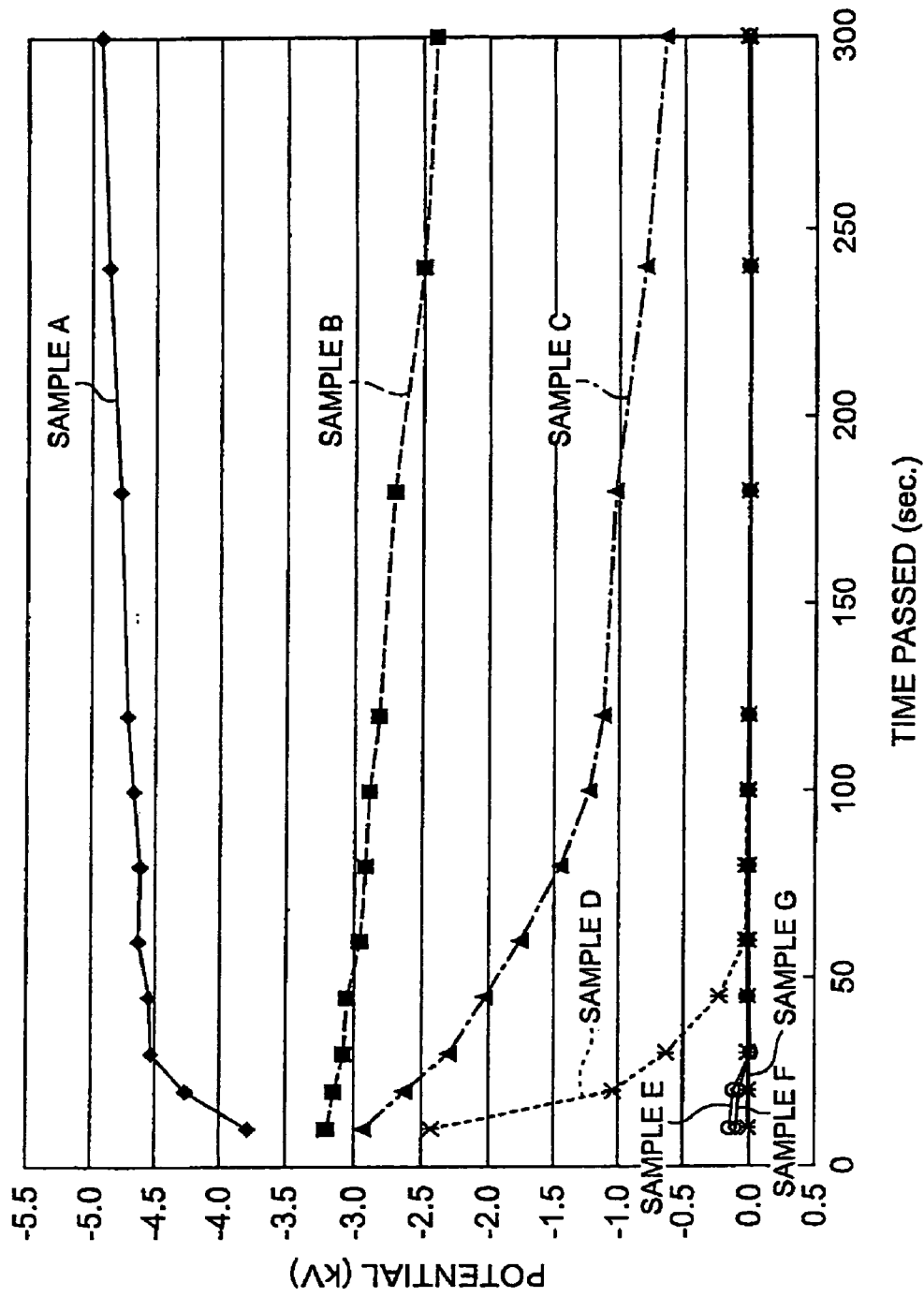
FIG. 7 is a graph plotting the data shown in the table of FIG. 6.

Also, how the surface potential of each sample changes with time was measured. Specifically, each sample was mounted on a hot plate at 90° C., and the surface potential was measured over a predetermined time. FIGS. 6 and 7 show the results. The data in the table of FIG. 6 are plotted in the graph of FIG. 7 whose abscissa and ordinate indicate the time passed (sec) and the potential (kV), respectively.

As can be seen from the graph of FIG. 7, each sample heated to 90° C. yields a surface potential of about −3.5 kV. Thereafter, the surface potential in sample A not doped with Fe decreases as time passes, whereas the surface potentials of samples B to G doped with Fe increase with time, so as to approach 0 kV. In samples B to G, those having a higher Fe dopant ratio approach 0 kV in a shorter time. Namely, the measurement results have verified that doping the substrate with Fe is quite effective in homogenizing the electric charge distribution in the thickness direction as well.

As explained in detail in the foregoing, the SAW device 10 includes the piezoelectric substrate 28 having a volume resistivity of $3.4 \times 10^{13}$ Ω·cm, whereby the electric charge distribution is homogenized therein. Therefore, discharging is restrained from occurring between the IDT electrodes 32, whereby characteristics are significantly kept from deteriorating. The SAW device 10 significantly keeping its characteristics from deteriorating can be obtained not only by the piezoelectric substrate whose volume resistivity is $3.4 \times 10^{13}$ Ω·cm, but also by any piezoelectric substrate whose volume resistivity is not less than $3.6 \times 10^{10}$ Ω·cm and not more than $1.5 \times 10^{14}$ Ω·cm.

In the SAW devices in accordance with the prior art (Japanese Patent Application Laid-Open Nos. HEI 10-107573, HEI 10-163802, HEI 10-126207, and 2001-168676), respective propagation characteristics of SAW devices made of the same piezoelectric substrate may deviate from each other unless protective films and the like having a uniform thickness are formed. By contrast, the piezoelectric substrate 28 is uniform throughout the substrate, whereby a plurality of SAW devices 10 made of the same piezoelectric substrate 28 have the same propagation characteristic.

Figure 8:
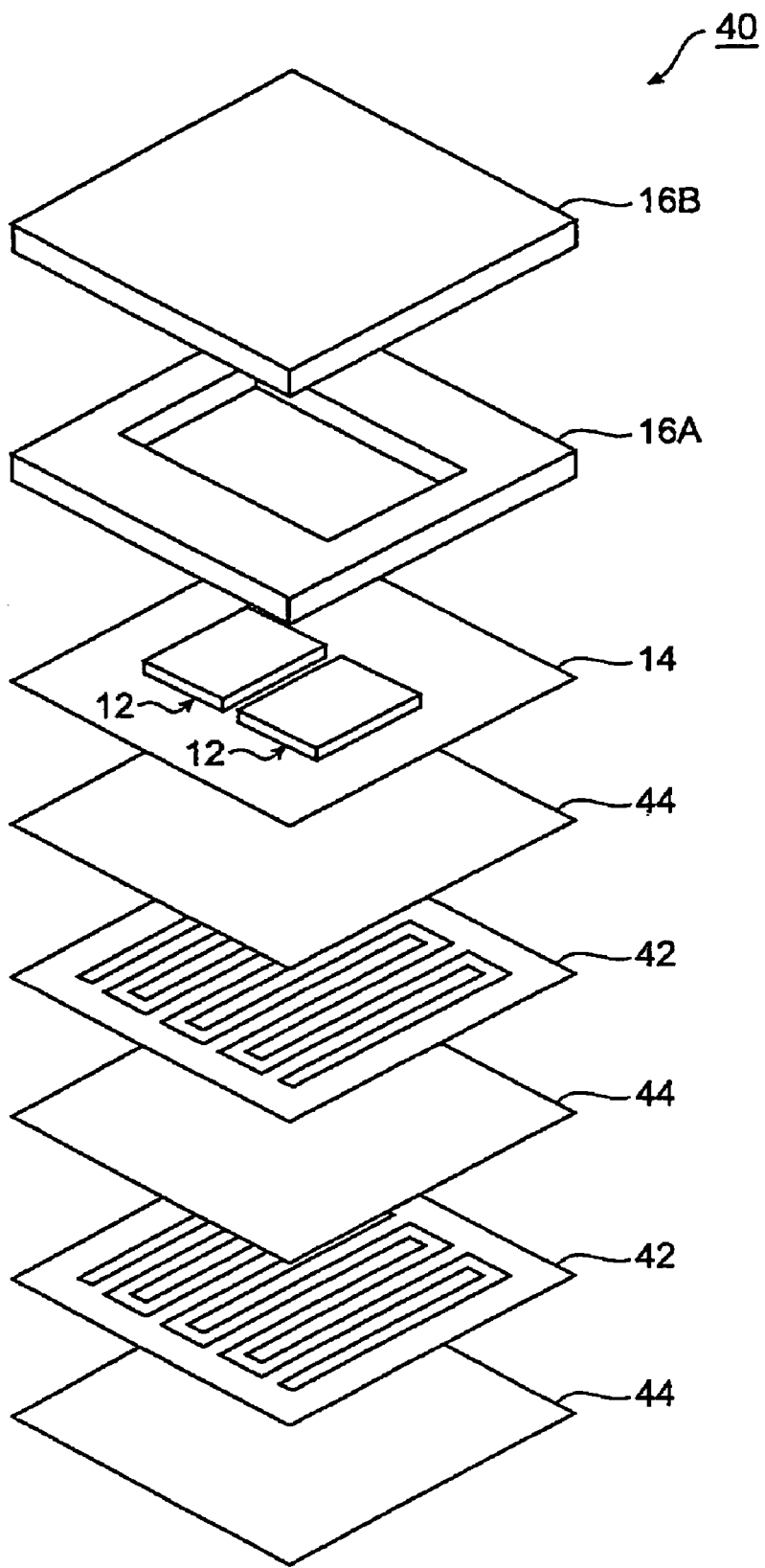
FIG. 8 is an exploded perspective view showing the surface acoustic wave duplexer in accordance with an embodiment of the present invention.

With reference to FIG. 8, a surface acoustic wave duplexer (hereinafter referred to as "SAW duplexer") equipped with the above-mentioned SAW element 12 will now be explained. FIG. 8 is an exploded perspective view showing the SAW duplexer in accordance with an embodiment of the present invention. This SAW duplexer 40 is an electronic component in which two filters, i.e., a transmitting filter and a receiving filter respectively used in a transmitting part and a receiving part of a cellular phone, are accommodated in a single package by using a branching circuit so as to share a single antenna Therefore, the SAW duplexer 40 comprises two SAW elements 12 which respond to different frequencies, respectively. The above-mentioned cover 16 is applied so as to closely seal the two SAW elements 12 mounted on the mount board 14. On the side opposite from the surface of the mount board 14 mounted with the SAW element 12, two layers of circuit boards 42 each provided with a delay circuit formed like square waves are laminated so as to alternate with insulating plates 44. Since such a SAW duplexer 40 utilizes the SAW elements 12 each including the piezoelectric substrate 28 having a low volume resistivity, the electric charge distribution is homogenized. This restrains discharging from occurring between the IDT electrodes 32, whereby characteristics are significantly kept from deteriorating.

Without being restricted to the embodiments mentioned above, the present invention can be modified in various manners. For example, the dopant for doping the piezoelectric substrate 28 is not limited to Fe, but may be Mn, Cu, or Ti, for example. Namely, as shown in the table of FIG. 9, the volume resistivity of the piezoelectric substrate 28 decreases when doped with Mn instead of Fe as in the case doped with Fe. Also, as shown in the table of FIG. 10, the volume resistivity of the piezoelectric substrate 28 decreases when doped with Cu instead of Fe as in the case doped with Fe. Further, as shown in the table of FIG. 11, the volume resistivity of the piezoelectric substrate 28 decreases when doped with Ti instead of Fe as in the case doped with Fe.

What is claimed is:

1. A surface acoustic wave element comprising a piezoelectric substrate, and an IDT electrode formed on the piezoelectric substrate;
   wherein the whole piezoelectric substrate is doped, the piezoelectric substrate being uniform throughout the substrate and has a volume resistivity of not less than $3.6 \times 10^{10}$ Ω·cm and not more than $1.5 \times 10^{14}$ Ω·cm, and wherein an electric charge distribution is uniform throughout a thickness direction of the substrate.

2. The surface acoustic wave element according to claim 1, wherein the piezoelectric substrate is doped with at least one species of dopants among Fe, Mn, Cu, and Ti.

3. The surface acoustic wave element according to claim 2, wherein the dopant ratio of the dopants is 1.24 wt % or less.

4. The surface acoustic wave element according to claim 1, wherein the piezoelectric substrate is mainly consisted of lithium tantalate.

5. The surface acoustic wave element according to claim 1, wherein the IDT electrode is consisted of Al or an Al alloy having a high orientation.

6. A surface acoustic wave device comprising:
   a surface acoustic wave element including a piezoelectric substrate, and an IDT electrode formed on the piezoelectric substrate;
   wherein the whole piezoelectric substrate is doped, the piezoelectric substrate being uniform throughout the substrate and has a volume resistivity of not less than $3.6 \times 10^{10}$ Ω·cm and not more than $1.5 \times 10^{14}$ Ω·cm, and wherein an electric charge distribution is uniform throughout a thickness direction of the substrate; and
   a mount board including an electrode terminal formed on a surface for mounting the surface acoustic wave element, the electrode terminal electrically connecting with the IDT electrode.

7. A duplexer comprising:
   a surface acoustic wave element including a piezoelectric substrate, and an IDT electrode formed on the piezoelectric substrate, the whole piezoelectric substrate being doped, and the piezoelectric substrate being uniform throughout the substrate and having a volume resistivity of not less than $3.6 \times 10^{10}$ Ω·cm and not more than $1.5 \times 10^{14}$ Ω·cm, and wherein an electric charge distribution is uniform throughout a thickness direction of the substrate.

8. A method of making a surface acoustic wave element, the method comprising the step of forming an IDT electrode on a piezoelectric substrate being uniform throughout the substrate, the whole piezoelectric substrate being doped with at least one species of dopants among Fe, Mn, Cu, and Ti, having a volume resistivity of not less than $3.6 \times 10^{10}$ Ω·cm and not more than $1.5 \times 10^{14}$ Ω·cm, and wherein an electric charge distribution is uniform throughout a thickness direction of the substrate.

9. The surface acoustic wave element according to claim 1, wherein the volume resistivity is uniform throughout the piezoelectric substrate due to uniformly distributed doping.

10. The surface acoustic wave device according to claim 6, wherein the volume resistivity is uniform throughout the piezoelectric substrate due to uniformly distributed doping.

11. The duplexer according to claim 2, wherein the volume resistivity is uniform throughout the piezoelectric substrate due to uniformly distributed doping.

12. The method according to claim 8, wherein the volume resistivity is uniform throughout the piezoelectric substrate due to uniformly distributed doping.

* * * * *